United States Patent [19]
Stuckert

[11] 3,920,233
[45] Nov. 18, 1975

[54] SPHERICAL SUPPORT AND TRANSLATION DEVICE FOR WAFERS

[75] Inventor: Paul E. Stuckert, Katonah, N.Y.

[73] Assignee: International Business Machines Corporation, Armonk, N.Y.

[22] Filed: June 11, 1974

[21] Appl. No.: 478,427

[52] U.S. Cl. .................. 269/55; 29/569; 51/216 LP; 250/292 A; 269/75
[51] Int. Cl.$^2$ .................. H01L 21/68
[58] Field of Search ............. 269/21, 55, 71, 73, 75; 250/292 A; 219/121 EB, 121 MB; 33/1 M, 174 TD; 29/583, 569; 51/216 LP, 217 L

[56] References Cited

UNITED STATES PATENTS

| | | | |
|---|---|---|---|
| 1,282,037 | 10/1918 | Bugbee | 51/216 LP |
| 1,383,524 | 7/1921 | Carlson | 269/73 |
| 2,441,472 | 5/1948 | d'Avaucourt | 51/216 LP |
| 2,585,287 | 2/1952 | Turner et al. | 51/216 LP |
| 2,736,993 | 3/1956 | Tripp | 51/237 R |
| 2,887,334 | 5/1959 | Adams, Sr. | 308/194 X |

*Primary Examiner*—Roy Lake
*Assistant Examiner*—Neil Abrams
*Attorney, Agent, or Firm*—Sughrue, Rothwell, Mion, Zinn & Macpeak

[57] ABSTRACT

A spherical motion table is provided which is capable of moving in the X and Y directions. A wafer holding carriage locates the periphery of the top surface of the wafer accurately relative to the top surface of said spherical motion table and imparts to the back surface of the wafer a spherical contour which, in turn, imparts a substantially spherical contour to the front surface of the wafer to eliminate or minimize variations in wafer geometry from wafer to wafer and within an individual wafer as the spherical motion table is moved in the X and Y directions in, for example, a photoresist or electron beam resist exposure process.

8 Claims, 6 Drawing Figures

SPHERICAL SUPPORT AND TRANSLATION DEVICE FOR WAFERS

BACKGROUND OF THE INVENTION

1. Field of the Invention

The present invention is directed to tables for supporting and positioning a wafer during exposure processes which are used in the fabrication of devices on semiconductor wafers.

2. Prior Art

Stepwise exposure processes which are used in the fabrication of devices on semiconductor wafers typically employ tables or stages which position the wafer at successive exposure locations. Frequently, an existing physical pattern on the wafer must be registered to a specified accuracy in three dimensional space relative to the next exposure image. Further, in each operation the exposure surface must be registered to a specified accuracy in the Z direction relative to the exposure image.

As circuit density increases and line width decreases the required registration tolerances decrease correspondingly. Furthermore, as line widths decrease, the registration tolerances in the Z direction imposed by the focal ranges of many photon and electron exposure devices also become more stringent. Assuming that the registration in the X and Y directions provided by the nature of and the control of the exposure device, the table, and the wafer holder or carriage which mounts upon the table is perfect, all remaining misregistration is due to variations in wafer geometry from wafer to wafer and variations in wafer geometry within an individual wafer. Thus, there is a distinct need for the control of wafer surface geometry, specifically in the Z direction, during exposure.

In prior art devices, since the top of the conventional X-Y table moves in a plane, control of the wafer geometry has centered on the development of wafer flatteners. The techniques of wafer flattening and the degree of success achieved by the various techniques varies considerably.

SUMMARY OF THE INVENTION

The present invention provides a spherical support and translation device which eliminates or minimizes variations in wafer geometry from wafer to wafer and variations in wafer geometry within an individual wafer.

The present invention provides a spherical support and translation device which specifically avoids wafer flattening as an objective, establishes a spherical wafer surface contour and provides X-Y table motion which is also spherical so that each exposure area is properly registered relative to the exposing image in the Z direction at all X and Y table positions.

The present invention provides a spherical motion X-Y table which is mounted for X-Y motion on a base having a convex spherical upper bearing surface of appropriate radius. The underside of the X-Y table has a corresponding concave spherical configuration complementary to the upper surface of the base and at least three bearing areas between the underside of the X-Y table and the top of the base, adjacent the periphery of both. A ball is located intermediate the spherical upper surface of the base and the lower surface of the table in each of the three bearing areas. A wafer holding carriage which may be permanently attached to the table or may be removable, is accurately positioned on the upper surface of the X-Y table. A backing plate is provided with a spherical upper surface of appropriate radius which presses against the bottom surface of the wafer while the upper periphery of the wafer is clamped between the backing plate and a flange on the carriage.

The foregoing objects, features and advantages of the invention will be apparent from the following more particular description of a preferred embodiment of the invention as illustrated in the accompanying drawings.

DETAILED DESCRIPTION OF THE INVENTION

In both optical and electron exposure techniques, the volume in which proper exposure will occur, to a first approximation, can be visualized as a coin shaped volume, i.e., a cylinder whose height is very small relative to its radius. Thus, in any stepwise exposure process in which areas are successively exposed, it is necessary to position each of the successively exposed areas completely within the coin-shaped exposure volume. Due to variations in wafer geometry, it is often necessary, in prior art arrangements, to reposition the wafer in the Z direction as well as in the X and Y directions for each successive exposure.

Figure 1A:
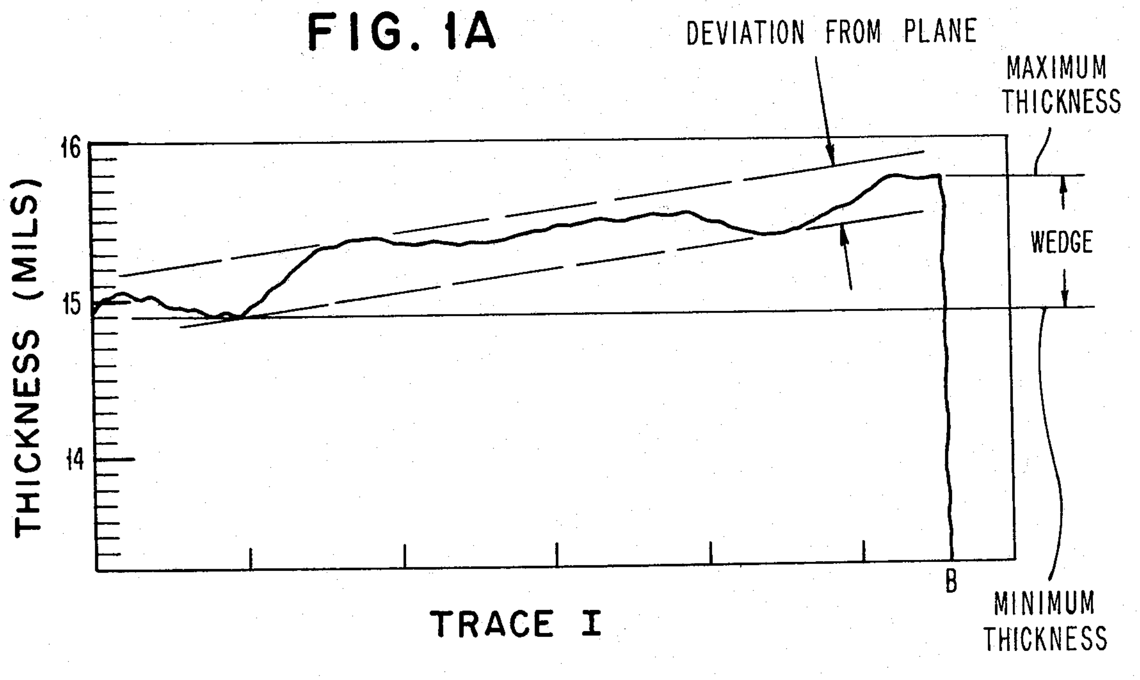
FIG. 1A is a graph wherein the thickness of a representative wafer is plotted in the direction of the arrow I in FIG. 1B from B to D.
Figure 1B:
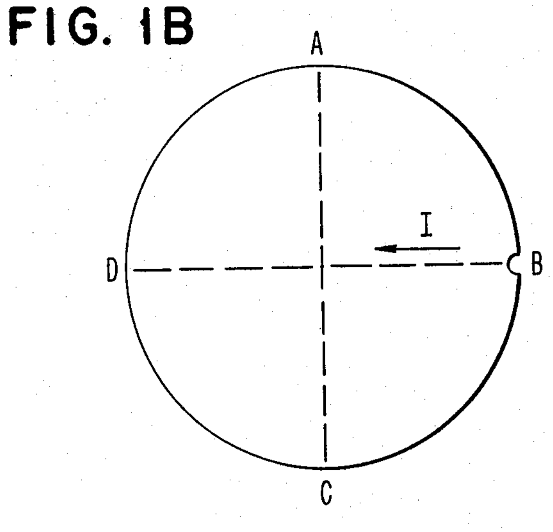
FIG. 1B is a schematic view of a representative wafer showing the coordinates thereof.

Exemplary data on wafer geometry variations as shown in the following Table and FIG. 1 illustrates the variation of several parameters of typical wafer samples. State of the art optical exposure devices may have focal ranges (i.e., the height of the coin-shaped volume) as small as 1 to 2 um and electron exposure devices may have focal ranges as small as 5 to 6 um. Comparison of these focal ranges with the data in the following Table shows the need for control of wafer geometry, specifically in the Z direction, during exposure.

Table I

| Wafer Characteristic | Unit | 50 Brand A wafers Mean | 50 Brand A wafers Standard Deviation | 50 Brand B wafers Mean | 50 Brand B wafers Standard Deviation |
|---|---|---|---|---|---|
| Average Thickness | um | 392 | 14.2 | 324 | 7.70 |
| Thickness Variation (Wedge or Taper) | um | 18.6 | 7.25 | 8.20 | 3.75 |
| Deviation from Plane (See FIG. 1A) | um | 9.55 | 4.00 | 4.25 | 2.75 |
| Free State Flatness (Bow or Dish) | um | 15.8 | 6.80 | 20.6 | 10.2 |

FIGS. 2A–2C and 3 show the details of the spherical motion X-Y table. A base 10 is provided with a spherical convex upper surface 12 having a central circular aperture 14 therethrough. The X-Y motion table 16 is provided with a substantially flat upper surface 18 and a substantially concave undersurface 11 having a curvature similar to the curvature of the top 12 of the base 10. Three areas 20, 22 and 24 on the undersurface of the table 16 are equally spaced from each other adjacent the periphery of the table. A spherical ball 25 made from a hard material, such as sapphire, which may be accurately dimensioned is disposed in each of the areas 20, 22 and 24 in contact with the table 16 and the spherical surface 12 of the base 10. A rod 26 is connected to the undersurface of the center of the table 16 to provide orientation and stability about the Z-axis and to provide transverse motion in X and Y. The rod 26 could be connected to the center of a flat bellows (not shown) which has significant mechanical compliance or give in the Z direction and negligible compliance in the X and Y directions which has its periphery affixed to the top of a conventional X-Y table (not shown). Alternatively, the rod 26 could be fitted with any number of types of X-Y cross-head actuators which are well known in the art.

A wafer holding carriage 28 which may be permanently attached to the table 16 or which, as shown, may be removable is supported and positioned on the table 16 by means of three very accurate conical points 30 of sapphire or the like, which mate with three correspondingly accurate conical holes 32 in the upper surface of the table 16. The main part of the carriage 28 is a cylindrical body having a radially inwardly directed circular flange 34 at the upper edge thereof. A support plate 36 is mounted within the carriage 28 by any suitable means such as three equally spaced pins 38 extending through the cylindrical wall of the carriage 28. A backing plate 40 is biased upwardly by means of springs 42 and the upper surface of the backing plate is provided with a spherical contour which bears against the undersurface of a wafer 44. The periphery of the circular wafer will be clamped between the flange 34 and the top surface of the backing plate 40 as a result of the spring pressure to firmly hold and contour the wafer to have substantially spherical lower and upper surfaces. The wafer could be rectangular or any other convenient shape and construction of the carriage and associated support elements would vary accordingly.

By the combined action of the parts described above, the periphery of the top surface of the wafer is accurately located relative to the table 16. The spherical contour of the upper surface of the backing plate 40 imparts a spherical contour to the back surface of the wafer which in turn, imparts a substantially spherical contour to the top surface of the wafer. These combined actions substantially eliminate variations in thickness from wafer to wafer, variations due to "wedge" or "taper" in a wafer and variations due to lack of wafer flatness, i.e., "bow" or "dish." However, variations due to deviation from plane still remain but are small compared to the other variations.

Figure 3:
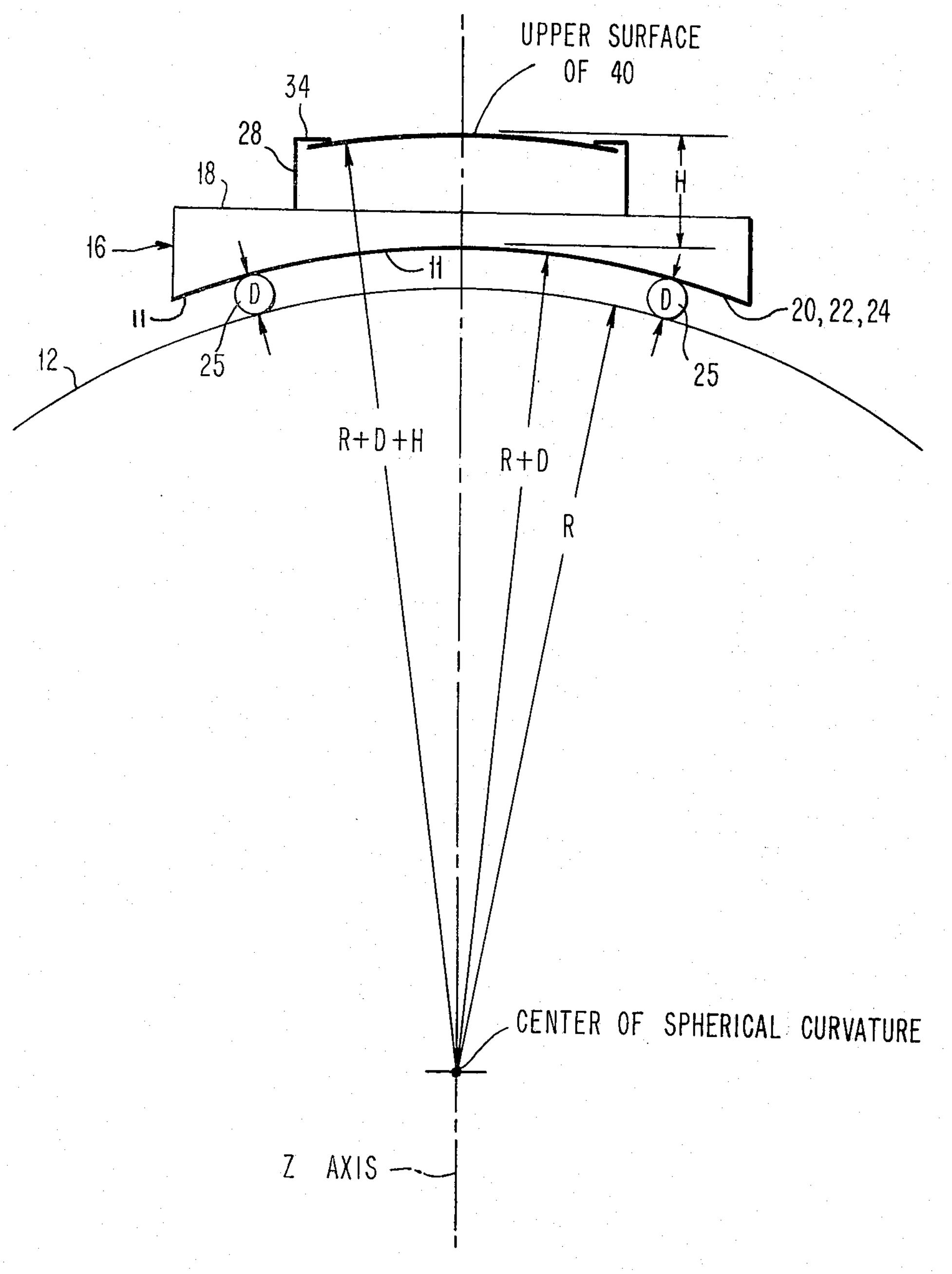
FIG. 3 shows, in simplified form, the radii of curvature of surfaces present in the table shown in FIG. 2.

The spherical surface of the backing plate 40, the spherical areas 20, 22 and 24, and the spherical surface 12 all have a common center of curvature and the radii of curvature of the three areas 20, 22 and 24 are identical. The relationships between the spherical radii of curvature of the top of the base 12, the bearing areas 20, 22 and 24 on the bottom of the table 16, and the top surface of the backing plate 40 are illustrated in FIG. 3. When, as shown in FIG. 3, the diameters of the spherical balls 25 are equal to D, the distance along the Z axis between the spherical surface on the bottom of the table 16 and the spherical upper surface of the backing plate 40 is equal to H, and the radius of curvature of the top of the base 12 is equal to R:

the radius of curvature of the bearing areas 20, 22 and 24 on the bottom of the table 16 is equal to $R + D$ and the radius of curvature of the top surface of the backing plate 40 is equal to $R + D + H$.

Figure 2A:
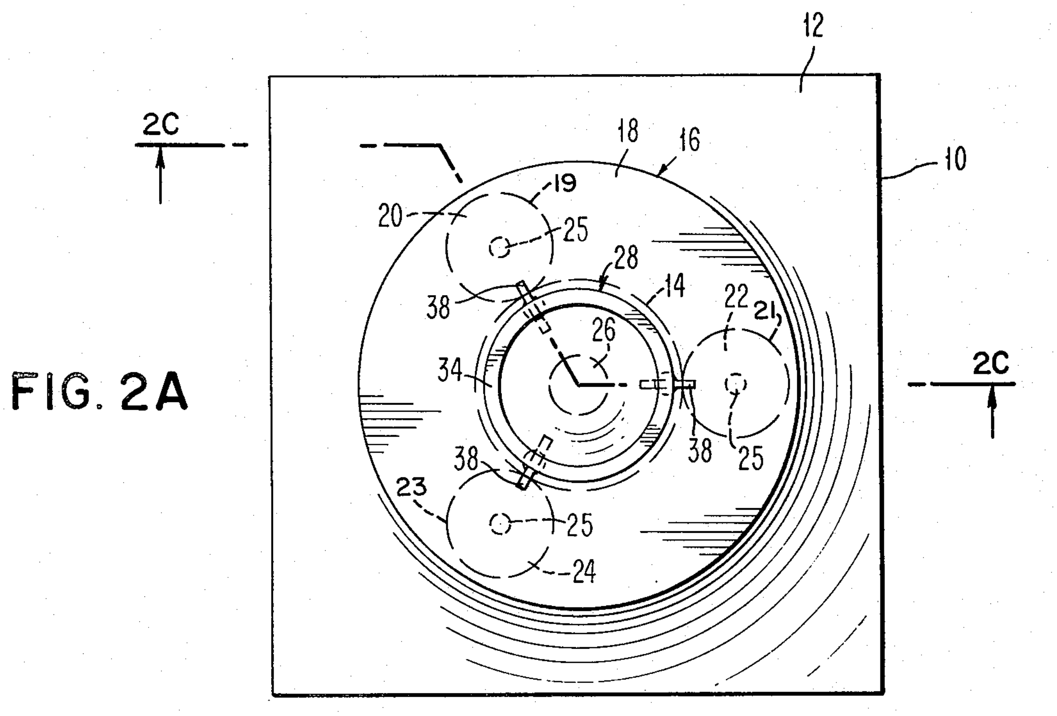
FIG. 2A is a top plan view of the spherical motion X–Y table according to the present invention.
Figure 2B:
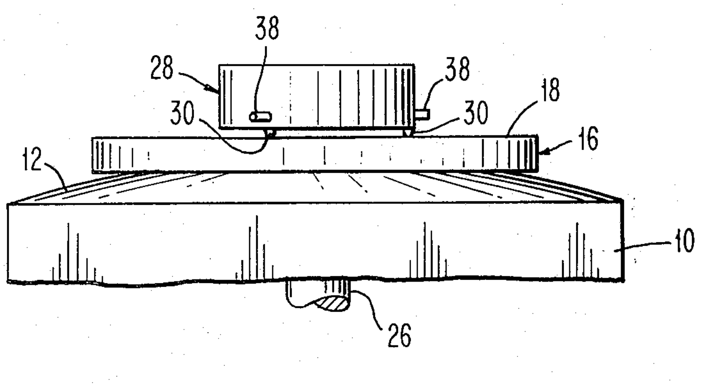
FIG. 2B is a side elevation view of the spherical motion table shown in FIG. 2A.
Figure 2C:
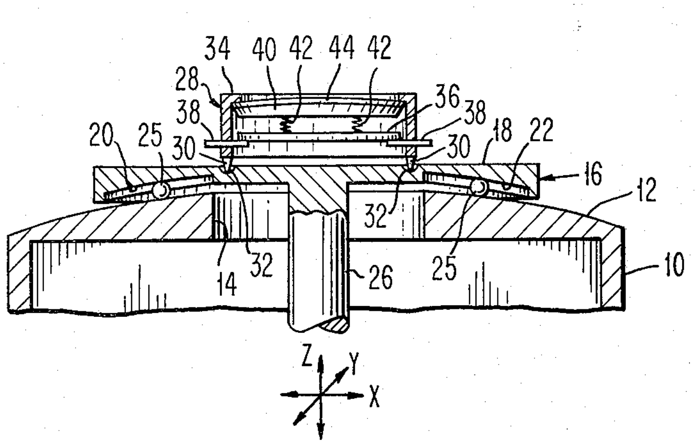
FIG. 2C is a sectional view taken along the line 2C—2C in FIG. 2A.

Thus, in manufacturing the table 16, the undersurface thereof could be provided with an overall concave spherical surface and circular ball retainers could be affixed to the undersurface at the appropriate locations to define the bearing areas 20, 22 and 24 to be engaged by the balls or spheres 25 or the retainers, constituted by the walls 19 and 21 could be of integral one-piece construction with the table as shown in FIG. 2C. A similar wall 23 would surround area 24.

The radii of curvature shown in FIGS. 2 and 3 are grossly exaggerated for purposes of illustration. Typical radii envisioned would be considerably greater. Assume that the action of the backing plate 40 produces an elevation of 0.1mm (0.004in.) at the center of the wafer relative to the plane of its periphery as defined by the flange 34. For a 57 mm (2.25 in.) wafer, the corresponding spherical radius of curvature of the wafer surface is approximately 3.64m (approximately 12 ft.). The radii of curvature of surfaces 12, 20, 22, and 24 in FIGS. 2C and 3 would be somewhat smaller.

The spherical motion table and carriage assembly described above also provides an additional important advantage. Since the under side of the wafer 44 and top side of the backing plate 40 are in intimate pressure contact, means for heat removal during exposure to minimize thermal expansion of the wafer are provided.

The following example shows the effectiveness of the heat dissipation in an electron beam exposure system wherein typical explosure and structural parameters are:

1. resist sensitivity is $5\times10^{-5}$ coulombs/cm$^2$,

2. beam voltage is 20 KV,

3. full exposure in a stepwise mode of the entire wafer surface of 51mm 2 inch diameter takes place,

4. all heat loss is by conduction through the wafer to the backing plate 40 only, that is, there is no heat loss by radiation or by conduction to the carriage flange 34 or to the table 16, and

5. the dimensions of the backing plate 40 are 10mm thick and 57mm in diameter and the material of the backing plate is aluminum. Using the foregoing conditions, all of which are near the worst or the worst case, the temperature rise of the wafer during exposure will be approximately 0.31 degrees centigrade. The resulting thermal expansion of the wafer across its 51mm diameter, assuming the wafer to be unconstrained, would be only approximately 0.0417um.

In summary, the spherical support and translation device minimizes or eliminates three out of four of the principle variations noted in the foregoing measurements of random wafer samples and provides an extremely effective heat removal arrangement during wafer exposure. The success is primarily attributed to supporting the wafer in a convex configuration as opposed to the flat support arrangement in prior art schemes. Although the preferred convex configuration is spherical as set forth in the above example, the support surface and the bearing surfaces could, under certain circumstances, be cylindrical. The present invention also contemplates the possibility of a concave support surface and correspondingly concave (convex) surfaces 12 (20, 22, and 24) in FIGS. 2 and 3 which in their preferred forms would also be spherical. In this case, the wafer would be forced or drawn into the concave depression to conform to the surface thereof by any suitable means such as vacuum or the like.

While the invention has been particularly shown and described with reference to a preferred embodiment thereof it will be understood by those skilled in the art that various changes in form and details may be made therein without departing from the spirit and scope of the invention.

What is claimed is:

1. A support and translation device for wafers during an exposure process comprising a base having a curved surface, a table having an oppositely curved undersurface complementary to the curved surface of said base, bearing means disposed intermediate said base and said table to support said table for movement relative to said base and carriage means mounted on said table, said carriage means including a backing plate having a continuous, non-perforated curved upper surface having the same center of curvature as the surface of said base for completely supporting a wafer and wafer clamping means mounted on said device and overlying said curved surface of said backing plate for holding a wafer against the curved surface of said backing plate to impart a curved configuration to the upper surface of said wafer.

2. A support and translation device as set forth in claim 1 wherein said curved surfaces are spherical and said curved undersurface of said table is provided with a plurality of spherical surface areas with all of said spherical surfaces and surface areas having a common center.

3. A support and translation device as set forth in claim 2 wherein said bearing means is comprised of a plurality of spherical elements and means for retaining each of said elements in engagement with a respective one of said spherical surface areas on said undersurface of said table.

4. A support and translation device as set forth in claim 2 wherein said spherical surfaces in said base and said backing plate are convex and said spherical undersurface of said table is concave.

5. A support and translation device as set forth in claim 1 wherein said base is provided with a central vertically disposed aperture and said table is provided with a rod extending downwardly through said aperture for engagement with lateral translation means.

6. A support and translation device as set forth in claim 4 further comprising a plurality of conical support points disposed on the bottom surface of said carriage means and a plurality of complementary apertures in the upper surface of said table for securely and accurately locating said carriage means on said table.

7. A support and translation device as set forth in claim 1 wherein said carriage means further comprises a housing having a radially inwardly directed flange adjacent the upper edge thereof and means for biasing said backing plate into engagement with said flange; said backing plate and said flange each having a peripheral configuration complementary to the periphery of the wafer to be supported whereby the edge of the wafer will be clamped between said backing plate and said flange.

8. A support and translation device as set forth in claim 7 wherein said backing plate is disposed in intimate pressure contact with the said wafer to effectively remove heat generated during exposure.

* * * * *